(12) United States Patent
Park et al.

(10) Patent No.: US 10,840,028 B2
(45) Date of Patent: Nov. 17, 2020

(54) PREPARING METHOD OF LARGE-AREA PEROVSKITE THIN FILM

(71) Applicants: Research & Business Foundation Sungkyunkwan University, Suwon-si (KR); Global Frontier Center For Multiscale Energy Systems, Seoul (KR)

(72) Inventors: Nam Gyu Park, Seoul (KR); Dong Nyuk Jung, Suwon-si (KR)

(73) Assignees: Research & Business Foundation Sungkyunkwan University, Suwon-si (KR); GLOBAL FRONTIER CENTER FOR MULTILSCALE ENERGY SYSTEMS, Seoul (KR)

(*) Notice: Subject to any disclaimer, the term of this patent is extended or adjusted under 35 U.S.C. 154(b) by 82 days.

(21) Appl. No.: 16/249,084

(22) Filed: Jan. 16, 2019

(65) Prior Publication Data

US 2019/0221371 A1    Jul. 18, 2019

(30) Foreign Application Priority Data

Jan. 18, 2018  (KR) ........................ 10-2018-0006682

(51) Int. Cl.
| | |
|---|---|
| *H01L 51/42* | (2006.01) |
| *H01G 9/00* | (2006.01) |
| *H01L 51/00* | (2006.01) |
| *H01G 9/20* | (2006.01) |
| *C07F 7/24* | (2006.01) |

(52) U.S. Cl.
CPC ......... *H01G 9/0036* (2013.01); *H01G 9/2009* (2013.01); *H01L 51/0003* (2013.01); *H01L 51/005* (2013.01); *H01L 51/0007* (2013.01); *H01L 51/0077* (2013.01); *C07F 7/24* (2013.01); *H01L 51/0028* (2013.01); *H01L 2251/306* (2013.01)

(58) Field of Classification Search
None
See application file for complete search history.

(56) References Cited

U.S. PATENT DOCUMENTS

| | | | |
|---|---|---|---|
| 2017/0084848 A1* | 3/2017 | Gao | ...................... C07C 209/68 |
| 2017/0365416 A1* | 12/2017 | Padture | ............... H01L 51/0032 |
| 2020/0111982 A1* | 4/2020 | Yu | ...................... H01L 51/5012 |

FOREIGN PATENT DOCUMENTS

| | | |
|---|---|---|
| JP | 2016-96277 A | 5/2016 |
| KR | 10-2015-0100216 A | 9/2015 |
| KR | 10-2017-0141756 A | 12/2017 |

OTHER PUBLICATIONS

Application of Methylamine Gas in Fabricating Organic-Inorganic Hybrid Perovskite Solar Cells (Energy Technology, 1750-1761).*

(Continued)

*Primary Examiner* — Ali Naraghi
(74) *Attorney, Agent, or Firm* — NSIP Law

(57) ABSTRACT

The present disclosure relates to a preparing method of a large-area perovskite thin film, comprising: forming an organic metal halide-alkylamine compound by exposing an organic metal halide compound having a perovskite structure to an alkylamine gas; preparing a coating solution by adding a solvent on the organic metal halide-alkylamine compound; and preparing a perovskite thin film by coating the coating solution on a substrate.

12 Claims, 12 Drawing Sheets

```
FORM ORGANIC METAL HALIDE-ALKYLAMINE COMPOUND
BY EXPOSING ORGANIC METAL HALIDE COMPOUND          — S100
HAVING PEROVSKITE STRUCTURE TO ALKYLAMINE GAS

PREPARE COATING SOLUTION BY ADDING SOLVENT          — S200
ON ORGANIC METAL HALIDE-ALKYLAMINE COMPOUND

PREPARE PEROVSKITE THIN FILM BY COATING COATING    — S300
SOLUTION ON SUBSTRATE
```

(56) References Cited

OTHER PUBLICATIONS

Sonia et al (Application of Methylamine Gas in Fabricating Organic-Inorganic Hybrid Perovskite Solar Cells (Energy Technology, 1750-1761)).*

Jeong, Dong-Nyuk et al., "Development of Viscolquid Coating Solution for Large area Perovskite Thin Films", *Hybrid & Organic Photovoltaics*, Poster Presentation by inventors, Lausanne, Switzerland, May 22, 2017 (11 pages in English).

* cited by examiner

Coating direction ↓

FIG.8

| Cell position | $J_{sc}$ (mA cm$^{-2}$) | $V_{oc}$ (V) | FF | PCE (%) |
|---|---|---|---|---|
| 1 | 21.716 | 1.1289 | 0.7578 | 18.58 |
| 2 | 20.484 | 1.1397 | 0.7828 | 18.28 |
| 3 | 21.076 | 1.1132 | 0.7776 | 18.24 |
| 4 | 20.266 | 1.093 | 0.7606 | 16.85 |
| 5 | 20.424 | 1.1064 | 0.7747 | 17.51 |
| 6 | 21.374 | 1.0983 | 0.7589 | 17.82 |
| 7 | 20.334 | 1.0967 | 0.7592 | 16.93 |
| 8 | 20.256 | 1.0998 | 0.774 | 17.24 |
| 9 | 20.42 | 1.1099 | 0.7793 | 17.66 |
| 10 | 20.559 | 1.0941 | 0.7748 | 17.43 |
| 11 | 20.134 | 1.1051 | 0.776 | 17.26 |
| 12 | 19.67 | 1.11 | 0.7744 | 16.91 |
| 13 | 20.18 | 1.1272 | 0.7618 | 17.33 |
| 14 | 20.12 | 1.0679 | 0.7557 | 16.24 |
| 15 | 19.906 | 1.1137 | 0.7582 | 16.81 |
| 16 | 19.268 | 1.1086 | 0.7809 | 16.68 |
| 17 | 19.469 | 1.0791 | 0.7955 | 16.71 |
| 18 | 19.633 | 1.1051 | 0.7646 | 16.59 |
| 19 | 19.652 | 1.0955 | 0.7734 | 16.65 |
| 20 | 19.775 | 1.0948 | 0.7695 | 16.66 |
| Average | 20.2358 | 1.10435 | 0.770485 | 17.219 |

PREPARING METHOD OF LARGE-AREA PEROVSKITE THIN FILM

TECHNICAL FIELD

The present disclosure relates to a preparing method of a large-area perovskite thin film.

BACKGROUND OF THE INVENTION

Due to the depletion of fossil energy and environmental pollution, the interest in alternative energy such as solar, wind and hydro energy has been increasing, and particularly, solar cells are being actively researched. In recent years, perovskite-based solar cells are being actively researched as next-generation solar cells.

A perovskite material has high absorption of visible light and a wide range of light absorption, and just a small amount of the perovskite material can generate a high short-circuit current and has a high open-circuit voltage as a cell element. Therefore, a perovskite solar cell has an excellent photoelectric conversion efficiency. Since a perovskite thin film used in the perovskite solar cell is thin, the cost of materials is low.

In a conventional preparing method of a large-area perovskite thin film, perovskite precursors have been dissolved in a solvent with a high boiling point and low vapor pressure and then used for coating. However, according to this method, supersaturated precursors are crystallized into perovskite materials by evaporation of the solvent and a solid phase perovskite thin film is formed, and, thus, a crystallization rate becomes very slow. Therefore, perovskite crystals are very large and grow in acicular form, and, thus, the thin film includes a lot of voids therein and a large number of pinholes are present therein. Accordingly, it has been difficult to prepare a high-quality perovskite thin film.

Korean Patent Laid-open Publication No. 2015-0100216 discloses a preparing method of a solid-type thin film solar battery, including: forming an optical electrode layer by forming a metal oxide thin film to a predetermined thickness as a blocking layer on a transparent electrode which is formed of a transparent material and has conductivity and attaching a dye having a perovskite structure to the blocking layer and then performing a heat treatment thereto; forming a hole transport layer by depositing a P-type metal oxide thin film on the optical electrode layer; forming a metal electrode which is formed of a conductive material on the hole transport layer; and forming an inorganic metal oxide layer by coating a solution containing an inorganic metal oxide that suppresses the permeation of moisture and oxygen on the metal electrode. However, in the perovskite thin film prepared by this method, perovskite crystals are large and grow in acicular form, and, thus, pinholes are present therein. Accordingly, the thin film has a non-uniform surface.

DISCLOSURE OF THE INVENTION

Problems to be Solved by the Invention

The present disclosure is conceived to solve the above-described problem of the conventional technology and provides a preparing method of a perovskite thin film which is uniform in large area and has an excellent quality.

However, problems to be solved by the present disclosure are not limited to the above-described problems. There may be other problems to be solved by the present disclosure.

Means for Solving the Problems

As a technical means for solving the above-described technical problems, a first aspect of the present disclosure provides a preparing method of a large-area perovskite thin film, comprising: forming an organic metal halide-alkylamine compound by exposing an organic metal halide compound having a perovskite structure to an alkylamine gas; preparing a coating solution by adding a solvent on the organic metal halide-alkylamine compound; and preparing a perovskite thin film by coating the coating solution on a substrate.

According to an embodiment of the present disclosure, the organic metal halide compound may be represented by the following Chemical Formula 1, but may not be limited thereto:

$$RMX_3 \qquad \text{[Chemical Formula 1]}$$

(In Chemical Formula 1,

R is a substituted or unsubstituted $C_{1-24}$ alkyl group, and when R is substituted, its substituent is an amino group, a hydroxyl group, a cyano group, a halogen group, a nitro group, or a methoxy group, M includes a metal selected from the group consisting of Pb, Cu, Ni, Co, Fe, Mn, Cr, Pd, Cd, Yb, Sn, Ge, and combinations thereof, and X includes a halide anion or a chalcogenide anion).

According to an embodiment of the present disclosure, the organic metal halide compound may have a single-crystal structure, but may not be limited thereto.

According to an embodiment of the present disclosure, the alkylamine gas may include a member selected from the group consisting of aliphatic primary alkylamines selected from the group consisting of methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine, octadecylamine, and combinations thereof; aliphatic secondary alkylamines selected from the group consisting of dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methylpropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethyl-t-butylamine, ethylisoamylamine, propylbutylamine, propylisobutylamine, and combinations thereof; and aliphatic tertiary alkylamines selected from the group consisting of trimethylamine, triethylamine, tripropylamine, tributylamine, tripentylamine, dimethylethylamine, dimethylpropylamine, methyldiethylamine, methyldipropylamine, and combinations thereof, but may not be limited thereto.

According to an embodiment of the present disclosure, the solvent may include a volatile organic solvent selected from the group consisting of acetonitrile, methanol, ethanol, acetone, butanol, isopropyl alcohol, and combinations thereof, but may not be limited thereto.

According to an embodiment of the present disclosure, the organic metal halide compound may be in a solid phase, but may not be limited thereto.

According to an embodiment of the present disclosure, the organic metal halide-alkylamine compound may be in a liquid phase, but may not be limited thereto.

According to an embodiment of the present disclosure, the organic metal halide compound may reversibly phase change between solid and liquid depending on partial pressure of the alkylamine gas, but may not be limited thereto.

According to an embodiment of the present disclosure, in the coating of the coating solution, crystallization of the perovskite may be rapidly performed due to a high evaporation rate of alkylamine to form a high-density thin film.

According to an embodiment of the present disclosure, the preparing method of a large-area perovskite thin film may be performed at room temperature, but may not be limited thereto.

According to an embodiment of the present disclosure, the preparing method of a large-area perovskite thin film may be performed without a separate heat treatment, but may not be limited thereto.

According to an embodiment of the present disclosure, the solvent may be contained in the coating solution in the amount of from 10 wt % to 70 wt %, but may not be limited thereto.

According to an embodiment of the present disclosure, the coating may be performed by a coating method selected from the group consisting of spin coating, casting, Langmuir-Blodgett, (LB) deposition, ink-jet printing, nozzle printing, slot die coating, doctor blade coating, screen printing, dip coating, gravure printing, reverse offset printing, a physical transfer method, spray coating, chemical vapor deposition, thermal evaporation, vacuum deposition, and combinations thereof, but may not be limited thereto.

The above-described aspects are provided by way of illustration only and should not be construed as liming the present disclosure. Besides the above-described examples, there may be additional examples described in the accompanying drawings and the detailed description.

Effects of the Invention

According to the above-described aspects of the present disclosure, a preparing method of a large-area perovskite thin film of the present disclosure makes it possible to perform rapid crystallization of perovskite due to a high evaporation rate of methylamine and thus prepare a uniform large-area perovskite thin film with high density.

The large-area perovskite thin film according to the present disclosure can obtain excellent average photoelectric conversion efficiency of 17% or more.

The preparing method of a large-area perovskite thin film of the present disclosure makes it possible to prepare a large-area perovskite thin film through a simple process without a separate heat treatment since perovskite particles are crystallized at room temperature.

The effects of the present disclosure are not limited to the aforementioned effects, and other effects, which are not mentioned above, will be apparent to a person with ordinary skill in the art from the following description.

BRIEF DESCRIPTION OF THE DRAWINGS

FIG. 8 is a table showing photoelectric properties of 20 sites on a large-area perovskite thin film prepared according to an example of the present disclosure.

DETAILED DESCRIPTION OF THE EMBODIMENTS

Figure 1:
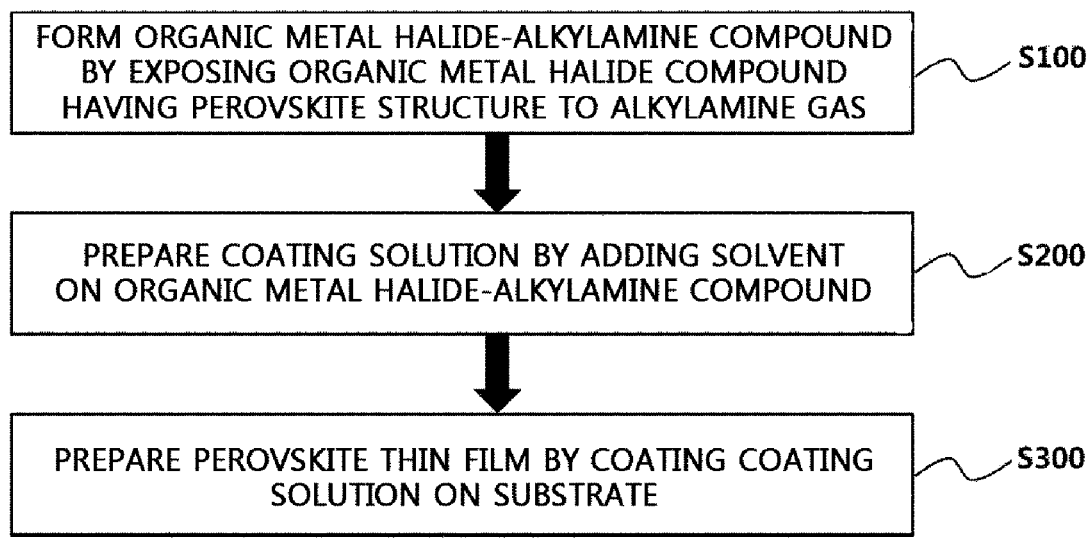
FIG. 1 is a flowchart showing a preparing method of a large-area perovskite thin film according to an embodiment of the present disclosure.

Hereafter, examples will be described in detail with reference to the accompanying drawings so that the present disclosure may be readily implemented by those skilled in the art. However, it is to be noted that the present disclosure is not limited to the examples but can be embodied in various other ways. In the drawings, parts irrelevant to the description are omitted for the simplicity of explanation, and like reference numerals denote like parts through the whole document.

Throughout this document, the term "connected to" may be used to designate a connection or coupling of one element to another element and includes both an element being "directly connected" another element and an element being "electronically connected" to another element via another element.

Through the whole document, the terms "on", "above", "on an upper end", "below", "under", and "on a lower end" that are used to designate a position of one element with respect to another element include both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Through the whole document, the term "alkyl group" typically refers to a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. If the alkyl group is substituted with an alkyl group, this may also be interchangeably used as "branched alkyl group". A substituent which can substitute for the alkyl group may include at least one selected from the group consisting of halo (for example, F, Cl, Br, I), haloalkyl (for example, $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—$NH_2$), carbamoyl (—C(O)—NHR), urea (—NH—C(O)—NHR—), and thiol (—SH), but may not be limited thereto. Further, an alkyl group having two or more carbon atoms among the above-described alkyl groups may include at least one carbon-carbon double bond or at least one carbon-carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, the alkyl group used herein may be an alkyl group having 1 to 10 carbon atoms, i.e., a methyl group, an ethyl group, a propyl group, a butyl group, a pentyl group, a hexyl group, a heptyl group, an octyl group, a nonyl group, or a decyl group, or an alkyl group having 1 to 6 carbon atoms, i.e., a methyl group, an ethyl group, a propyl group, a butyl group, a pentyl group, or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

Through the whole document, the term "halogen" or "halo" refers to a halogen element from Group 17 of the periodic table included as a functional group in a compound and may include, for example, chlorine, bromine, fluorine or iodine, but may not be limited thereto.

Hereafter, a preparing method of a large-area perovskite thin film of the present disclosure will be described in detail with reference to embodiments, examples and the accompanying drawings. However, the present disclosure may not be limited to the embodiments, examples, and drawings.

A first aspect of the present disclosure relates to a preparing method of a large-area perovskite thin film, comprising: forming an organic metal halide-alkylamine compound by exposing an organic metal halide compound having a perovskite structure to an alkylamine gas; preparing a coating solution by adding a solvent on the organic metal halide-alkylamine compound; and preparing a perovskite thin film by coating the coating solution on a substrate.

Figure 2:
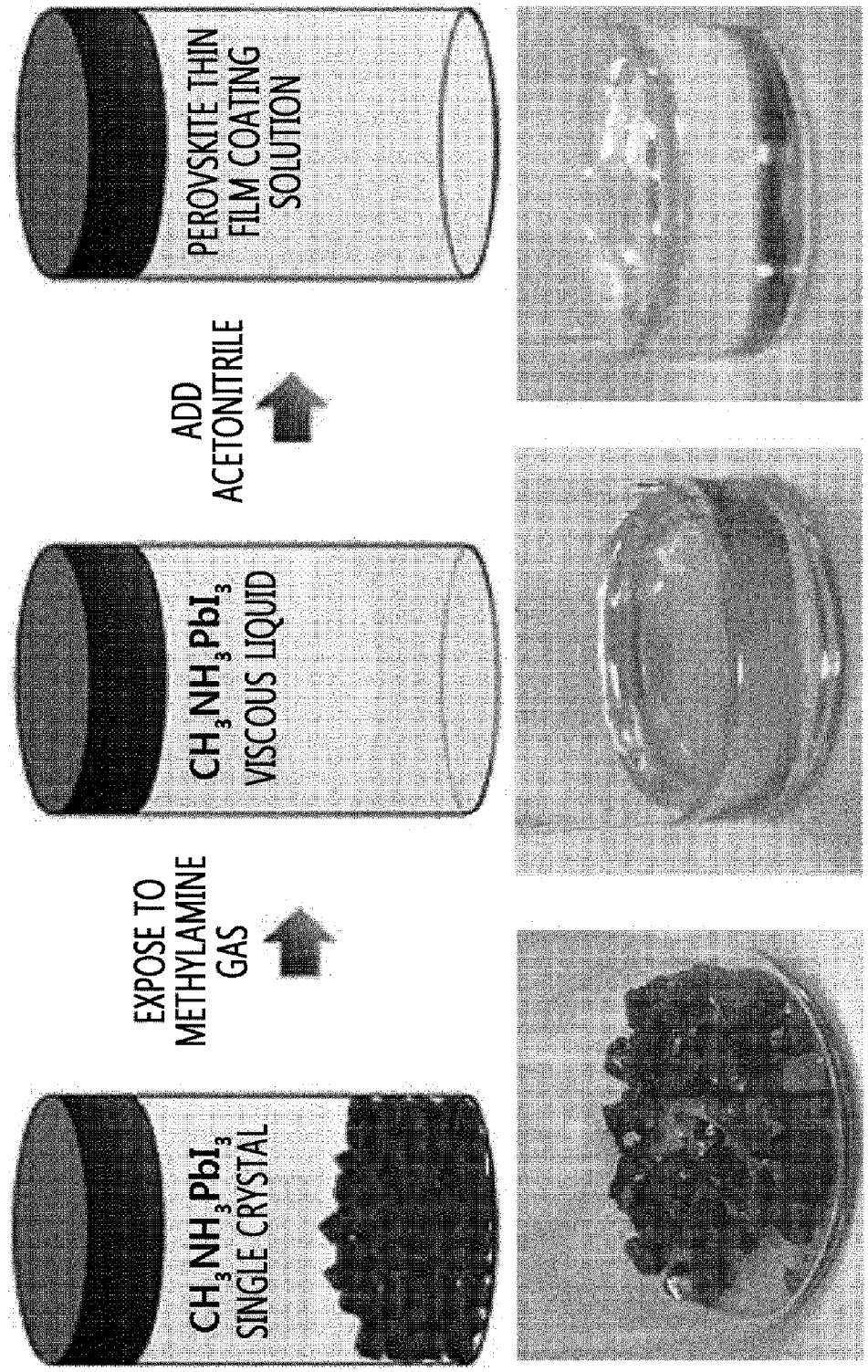
FIG. 2 is a diagram showing the preparing method of a large-area perovskite thin film according to an example of the present disclosure.

FIG. 1 is a flowchart showing a preparing method of a large-area perovskite thin film according to an embodiment of the present disclosure, and FIG. 2 is a diagram showing the preparing method of a large-area perovskite thin film according to an example of the present disclosure.

Hereafter, the preparing method will be described with reference to FIG. 1 and FIG. 2.

First, an organic metal halide-alkylamine compound is formed by exposing an organic metal halide compound having a perovskite structure to an alkylamine gas (S100).

A conventional large-area perovskite thin film is typically prepared by spin-coating a coating solution in which perovskite precursor materials are mixed at an equivalent ratio and dissolved in an aprotic polar solvent with a high boiling point. In such a large-area perovskite thin film, supersaturated precursors are crystallized into perovskite materials by evaporation of the solvent and a solid phase perovskite thin film is formed, and, thus, a crystallization rate is slow. Therefore, perovskite crystals are large and grow in acicular form, and, thus, the thin film includes a lot of voids therein and a large number of pinholes are present therein. Accordingly, the quality of the thin film may be degraded.

However, according to the preparing method of a large-area perovskite thin film of the present disclosure, a single-crystal organic metal halide compound having a perovskite structure is exposed to an alkylamine gas, e.g., a methylamine gas, and, thus, crystallization of the perovskite may be rapidly performed due to rapid evaporation of methylamine to form a high-density large-area perovskite thin film with uniform perovskite crystals.

According to an embodiment of the present disclosure, the organic metal halide compound may have a single-crystal structure, but may not be limited thereto.

The organic metal halide compound having the single-crystal structure has a high purity, and, thus, if it is used to prepare a perovskite thin film, a high photoelectric conversion efficiency can be obtained.

According to an embodiment of the present disclosure, the organic metal halide compound may be represented by the following Chemical Formula 1, but may not be limited thereto:

$$RMX_3 \quad \text{[Chemical Formula 1]}$$

(In Chemical Formula 1,

R is a substituted or unsubstituted $C_{1-24}$ alkyl group, and when R is substituted, its substituent is an amino group, a hydroxyl group, a cyano group, a halogen group, a nitro group, or a methoxy group, M includes a metal selected from the group consisting of Pb, Cu, Ni, Co, Fe, Mn, Cr, Pd, Cd, Yb, Sn, Ge, and combinations thereof, and X includes a halide anion or a chalcogenide anion).

In an embodiment of the present disclosure, in Chemical Formula 1, R is a monovalent organic ammonium ion represented by $(R^1R^2R^3R^4N)^+$ and $R^1$ to $R^4$ may each independently include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R is a monovalent organic ammonium ion represented by $(R^5—NH_3)^+$, and $R^5$ may include a member selected from the group consisting of a linear or branched alkyl group having 1 to 24 carbon atoms, a cycloalkyl group having 3 to 20 carbon atoms, an aryl group having 6 to 20 carbon atoms, and combinations thereof, but may not be limited thereto.

In an embodiment of the present disclosure, in Chemical Formula 1, R may be represented by Chemical Formula $(R^6R^7N=CH—NR^8R^9)^+$, and $R^6$ may be hydrogen, an unsubstituted or substituted alkyl group having 1 to 20 carbon atoms, or an unsubstituted or substituted aryl group; $R^7$ may be hydrogen, an unsubstituted or substituted alkyl group having 1 to 20 carbon atoms, or an unsubstituted or substituted aryl group; $R^8$ may be hydrogen, an unsubstituted or substituted alkyl group having 1 to 20 carbon atoms, or an unsubstituted or substituted aryl group; and $R^9$ may be hydrogen, an unsubstituted or substituted alkyl group having 1 to 20 carbon atoms, or an unsubstituted or substituted aryl group, but may not be limited thereto.

The alky group used herein may be a substituted or unsubstituted, linear or branched chain saturated radical, and it is often a substituted or an unsubstituted linear chain saturated radical and may be, for example, an unsubstituted linear chain saturated radical, but may not be limited thereto. For example, the alkyl group having 1 to 20 carbon atoms used herein may be a substituted or unsubstituted, linear or branched chain saturated hydrocarbon radical, but may not be limited thereto.

When the alkyl group is substituted, its substituent may include one or more substituents selected from the following examples, but may not be limited thereto. The substituent may include an substituted or unsubstituted alkyl group having 1 to 20 carbon atoms, a substituted or unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, an oxo group, a halo group, a carboxy group, an ester group, an acyl group, an acyloxy group, an alkoxy group having 1 to 20 carbon atoms, an aryloxy group, a haloalkyl group, a sulfonic acid group, a sulfone group (i.e., thiol, —SH), an alkylthio group having 1 to 10 carbon atoms, an arylthio group, a sulfonyl group, a phosphate group, a phosphate ester group, a phosphonic acid group, and a phosphonate ester group, but may not be limited thereto. For example, the substituted alkyl group may include a halogen alkyl group, a hydroxy alkyl group, an alkoxy alkyl group, or an alkaryl group, but may not be limited thereto. The alkaryl group pertains to a substituted alkyl group having 1 to 20 carbon atoms and refers to an alkyl group in which at least one hydrogen atom has been substituted with an aryl group. For example, the aryl group that substitutes for the at least one hydrogen atom may include a benzyl group (phenylmethyl, $PhCH_2$—), a benzhydryl group ($Ph_2CH$—), a trityl group (triphenylmethyl, $Ph_3C$—), phenethyl ($Ph-CH_2CH_2$—), a styryl group ($PhCH=CH$—), or a cinnamyl group ($PhCH=CHCH_2$—), but may not be limited thereto.

For example, $R^1$ to $R^{10}$ may be each independently an alkyl group, and the alkyl group may be a linear or branched alkyl group having 1 to 24 carbon atoms, 1 to 20 carbon atoms, 1 to 10 carbon atoms, 1 to 8 carbon atoms, 1 to 5 carbon atoms, or 1 to 3 carbon atoms. When the alkyl group is substituted with another alkyl group, it may also be referred to as "branched alkyl group". A substituent for the alkyl group may include at least one member selected from the group consisting of halo (e.g., F, Cl, Br, I), haloalkyl (e.g., $CCl_3$ or $CF_3$), alkoxy, alkylthio, hydroxy, carboxy (—C(O)—OH), alkyloxy carbonyl (—C(O)—O—R), alkyl carbonyloxy (—O—C(O)—R), amino (—$NH_2$), carbamoyl (—C(O)—NHR), urea (—NH—C(O)—NHR—), and thiol (—SH), but may not be limited thereto. Further, an alkyl group having 2 or more carbon atoms among the above-described alkyl groups may include at least one carbon to carbon double bond or at least one carbon to carbon triple bond, but may not be limited thereto. For example, the alkyl group may include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, nonadecyl, acosanyl, or all the possible isomers thereof, but may not be limited thereto. For example, $R^1$ to $R^4$ and $R^5$ or an alkyl group which can be substituted therefor may be each independently an alkyl group having 1 to 10 carbon atoms, i.e., a methyl group, an ethyl group, a propyl group, a butyl group, a pentyl group, a hexyl group, a heptyl group, an octyl group, a nonyl group or a decyl group, or an alkyl group having 1 to 6 carbon atoms, i.e., a methyl group, an ethyl group, a propyl group, a butyl group, a pentyl group or a hexyl group, or an alkyl group having 1 to 4 carbon atoms, i.e., a methyl group, an ethyl group, an i-propyl group, a n-propyl group, a t-butyl group, a s-butyl group, or a n-butyl group, but may not be limited thereto.

For example, when the alkyl group is substituted, there may be one, two, or three substituents which can be substituted for the alkyl group, but may not be limited thereto. The aryl group among the substituents independently described for each of $R^1$ to $R^{10}$ is a substituted or unsubstituted, monocyclic or bicyclic aromatic group which may have from 6 to 14 carbon atoms, desirably from 6 to 10 carbon atoms in the aromatic ring portion. For example, the aryl group used herein may include a phenyl group, a naphthyl group, an indenyl group, and an indanyl group, but may not be limited thereto. The aryl group may be substituted or may not be substituted. When the aryl group defined above is substituted, its substituent may include one or more substituents selected from the following examples, but may not be limited thereto. The substituent may include an unsubstituted alkyl group having 1 to 6 carbon atoms (forming an aralkyl group), an unsubstituted aryl group, a cyano group, an amino group, an alkyl amino group having 1 to 10 carbon atoms, a dialkyl amino group having 1 to 10 carbon atoms, an aryl amino group, a diaryl amino group, arylalkyl amino group, an amino group, an amide group, a hydroxy group, a halo group, a carboxy group, an ester group, an acyl group, an acyloxy group, an alkoxy group having 1 to 20 carbon atoms, an aryloxy group, a haloalkyl group, a sulfhydryl group (i.e., thiol, —SH), an alkylthio group having 1 to 10 carbon atoms, an arylthio group, a sulfonic acid group, a phosphate group, a phosphate ester group, a phosphonic acid group, and a sulfonyl group, but may not be limited thereto. For example, the substituted aryl group may have one, two, or three substituents, but may not be limited thereto. For example, the substituted aryl group may be substituted in two positions with a single alkylene group having 1 to 6 carbon atoms, or with a bidentate group represented by Chemical Formula [—X—($C_1$-$C_6$)alkylene] or Chemical Formula [—X—($C_1$-$C_6$)alkylene-X—]. Herein, X may be selected from 0, S and NR and R may be H, an aryl group or an alkyl group having 1 to 6 carbon atoms. For example, the substituted aryl group may be an aryl group fused with a cycloalkyl group or with a heterocyclyl group. For example, the ring atoms of an aryl group may include one or more heteroatoms as in a heteroaryl group. Such an aryl group or a heteroaryl group is a substituted or unsubstituted mono- or bicyclic heteroaromatic group which contains from 6 to 10 atoms in the ring portion including one or more heteroatoms. For example, a 5- or 6-membered ring may contain at least one heteroatom selected from O, S, N, P, Se and Si. For example, one, two, or three heteroatoms may be contained. For example, the heteroaryl group may include a pyridyl group, a pyrazinyl group, a pyrimidinyl group, a pyridazinyl group, a furanyl group, a thienyl group, a pyrazolidinyl group, a pyrrolyl group, an oxazolyl group, an oxadiazolyl group, an isoxazolyl group, a thiadiazolyl group, a thiazolyl group, an isothiazolyl group, an imidazolyl group, a pyrazolyl group, a quinolyl group, and an isoquinolyl group, but may not be limited thereto. For example, the heteroaryl group may not be substituted or may be substituted as described above for the aryl group. When the heteroaryl group is substituted, there may be, for example, one, two, or three substituents, but may not be limited thereto.

In an embodiment of the present disclosure, in Chemical Formula 1, R may include an alkali metal cation in addition to the organic cation, i.e., a mixed cation of the organic cation and the alkali metal cation, but may not be limited thereto. In this case, a molar ratio of the alkali metal cation to all cations of R in Chemical Formula 1 may be more than 0 to 0.2, but may not be limited thereto. The alkali metal cation may include a cation of a metal selected from the group consisting of Cs, K, Rb, Mg, Ca, Sr, Ba, and combinations thereof, but may not be limited thereto.

In an embodiment of the present disclosure, in Chemical Formula 1, X may include a halide anion or a chalcogenide anion, but may not be limited thereto. For example, in Chemical Formula 1, X may include one kind or two or more kinds of anions, for example, one or more kinds of halide anions, one or more kinds of chalcogenide anions, or mixed anions thereof. For example, in Chemical Formula 1, X may include a member selected from the group consisting of $F^-$, $Cl^-$, $Br^-$, $I^-$, $S^{2-}$, $Se^{2-}$, $Te^{2-}$, and combinations thereof, but may not be limited thereto. For example, in Chemical Formula 1, X may include one or more kinds of anions selected from the group consisting of $F^-$, $Cl^-$, $Br^-$, $I^-$, and combinations thereof as a monovalent halide anion, but may not be limited thereto. For example, in Chemical Formula 1, X may include a member selected from the group consisting of $S^{2-}$, $Se^{2-}$, $Te^{2-}$, and combinations thereof as a divalent chalcogenide anion, but may not be limited thereto.

In an embodiment of the present disclosure, the organic metal halide compound in Chemical Formula 1 may include a member or two or more members selected from $CH_3NH_3PbI_xCl_y$ (x and y are real numbers satisfying $0 \leq x \leq 3$, $0 \leq y \leq 3$, and $x+y=3$), $CH_3NH_3PbI_xBr_y$ (x and y are real numbers satisfying $0 \leq x \leq 3$, $0 \leq y \leq 3$, and $x+y=3$), $CH_3NH_3PbCl_xBr_y$ (x and y are real numbers satisfying $0 \leq x \leq 3$, $0 \leq y \leq 3$, and $x+y=3$), and $CH_3NH_3PbI_xF_y$ (x and y are real numbers satisfying $0 \leq x \leq 3$, $0 \leq y \leq 3$, and $x+y=3$), and may include a member or two or more members selected from $(CH_3NH_3)_2PbI_xCl_y$ (x and y are real numbers satisfying $0 \leq x \leq 4$, $0 \leq y \leq 4$, and $x+y=4$), $(CH_3NH_3)_2PbI_xBr_y$ (x and y are real numbers satisfying $0 \leq x \leq 4$, $0 \leq y \leq 4$, and $x+y=4$), $(CH_3NH_3)_2PbCl_xBr_y$ (x and y are real numbers satisfying $0 \leq x \leq 4$, $0 \leq y \leq 4$, and $x+y=4$), and $(CH_3NH_3)_2PbI_xF_y$ (x and y are real numbers satisfying $0 \leq x \leq 4$, $0 \leq y \leq 4$, and $x+y=4$), but may not be limited thereto.

In an embodiment of the present disclosure, the organic metal halide compound in Chemical Formula 1 may include a member or two or more members selected from $CH_3NH_3PbI_3$ (hereafter, also referred to as "MAPbI$_3$"), $CH_3NH_3PbBr_3$ (hereafter, also referred to as "MAPbBr$_3$"), $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$, and $CH_3NH_3SnF_2Cl$, but may not be limited thereto.

For example, the organic metal halide compound in Chemical Formula 1 may include a member or two or more members selected from $CH_3CH_2NH_3PbI_3$, $CH_3CH_2NH_3PbBr_3$, $CH_3CH_2NH_3PbCl_3$, $CH_3CH_2NH_3PbF_3$, $CH_3CH_2NH_3PbBrI_2$, $CH_3CH_2NH_3PbBrCl_2$, $CH_3CH_2NH_3PbIBr_2$, $CH_3CH_2NH_3PbICl_2$, $CH_3CH_2NH_3PbClBr_2$, $CH_3CH_2NH_3PbI_2Cl$, $CH_3CH_2NH_3SnBrI_2$, $CH_3CH_2NH_3SnBrCl_2$, $CH_3CH_2NH_3SnF_2Br$, $CH_3CH_2NH_3SnIBr_2$, $CH_3CH_2NH_3SnICl_2$, $CH_3CH_2NH_3SnF_2I$, $CH_3CH_2NH_3SnClBr_2$, $CH_3CH_2NH_3SnI_2Cl$, and $CH_3NH_3SnF_2Cl$, but may not be limited thereto.

For example, the organic metal halide compound in Chemical Formula 1 may include a member or two or more members selected from $CH_3(CH_2)_2NH_3PbI_3$, $CH_3(CH_2)_2NH_3PbBr_3$, $CH_3(CH_2)_2NH_3PbCl_3$, $CH_3(CH_2)_2NH_3PbF_3$, $CH_3(CH_2)_2NH_3PbBrI_2$, $CH_3(CH_2)_2NH_3PbBrCl_2$, $CH_3(CH_2)_2NH_3SnF_2Br$, $CH_3(CH_2)_2NH_3SnICl_2$, $CH_3(CH_2)_2NH_3SnF_2I$, $CH_3(CH_2)_2NH_3SnI_2Cl$, and $CH_3(CH_2)_2NH_3SnF_2Cl$, but may not be limited thereto.

For example, the organic metal halide compound in Chemical Formula 1 may include a member or two or more members selected from $CH_3(CH_2)_3NH_3PbI_3$, $CH_3(CH_2)_3NH_3PbBr_3$, $CH_3(CH_2)_3NH_3PbCl_3$, $CH_3(CH_2)_3NH_3PbF_3$, $CH_3(CH_2)_3PbBrI_2$, $CH_3(CH_2)_3NH_3PbBrCl_2$, $CH_3(CH_2)_3NH_3PbIBr_2$, $CH_3(CH_2)_3NH_3PbICl_2$, $CH_3(CH_2)_3NH_3PbClBr_2$, $CH_3(CH_2)_3NH_3PbI_2Cl$, $CH_3(CH_2)_3NH_3SnF_2Br$, $CH_3(CH_2)_3NH_3SnF_2I$, and $CH_3(CH_2)_3NH_3SnF—Cl$, but may not be limited thereto.

For example, the organic metal halide compound according to an embodiment of the present disclosure may include $CH_3NH_3PbI_3$.

According to an embodiment of the present disclosure, the alkylamine gas may include a member selected from the group consisting of aliphatic primary alkylamines selected from the group consisting of methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine, octadecylamine, and combinations thereof; aliphatic secondary alkylamines selected from the group consisting of dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methylpropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethyl-t-butylamine, ethylisoamylamine, propylbutylamine, propylisobutylamine, and combinations thereof; and aliphatic tertiary alkylamines selected from the group consisting of trimethylamine, triethylamine, tripropylamine, tributylamine, tripentylamine, dimethylethylamine, dimethylpropylamine, methyldiethylamine, methyldipropylamine, and combinations thereof, but may not be limited thereto. Desirably, the alkylamine gas may include methylamine.

According to an embodiment of the present disclosure, the organic metal halide compound may be in a solid phase, but may not be limited thereto.

According to an embodiment of the present disclosure, the organic metal halide-alkylamine compound may be in a liquid phase, but may not be limited thereto.

According to an embodiment of the present disclosure, the organic metal halide compound may reversibly phase change between solid and liquid depending on partial pressure of the alkylamine gas, but may not be limited thereto.

As shown in FIG. 2, the organic metal halide compound in a solid phase, e.g., $CH_3NH_3PbI_3$ single crystals, is exposed to the alkylamine gas, e.g., a methylamine gas, and, thus, an organic metal halide-alkylamine compound in a high viscosity liquid phase, e.g., $CH_3NH_3PbI_3 \cdot CH_3NH_2$, may be formed by a partial pressure of the methylamine gas and the organic metal halide-alkylamine compound may form a large-area perovskite thin film through a solution process.

Then, a coating solution may be prepared by adding a solvent on the organic metal halide-alkylamine compound (S200).

According to an embodiment of the present disclosure, the solvent may include a volatile organic solvent selected from the group consisting of acetonitrile, methanol, ethanol, acetone, butanol, isopropyl alcohol, and combinations thereof, but may not be limited thereto. Desirably, the solvent may include acetonitrile.

When the solvent is added to the organic metal halide-alkylamine compound, the viscosity and concentration of the high-viscosity organic metal halide-alkylamine compound may be reduced, and, thus, coating may be performed continuously on a large-area substrate.

According to an embodiment of the present disclosure, the solvent may be contained in the coating solution in the amount of from 10 wt % to 70 wt %, but may not be limited thereto. Desirably, the solvent may be contained in the coating solution in the amount of 40 wt %.

If the coating solution contains the solvent in a small amount, the viscosity and concentration of the coating solution may increase, which may cause an increase in thickness of the perovskite thin film, and if the coating solution contains the solvent in a large amount, the viscosity and concentration of the coating solution may decrease, which may cause a decrease in thickness of the perovskite thin film. Further, if the solvent is excessively contained in the coating solution as compared to an evaporation rate, a perovskite thin film with degraded quality may be prepared.

Then, a perovskite thin film is prepared by coating the coating solution on a substrate (S300).

According to an embodiment of the present disclosure, in the coating of the coating solution, crystallization of the perovskite may be rapidly performed due to a high evaporation rate of the alkylamine to form a high-density thin film.

According to an embodiment of the present disclosure, the preparing method of a large-area perovskite thin film may be performed at room temperature, but may not be limited thereto.

According to an embodiment of the present disclosure, the preparing method of a large-area perovskite thin film may be performed without a separate heat treatment, but may not be limited thereto.

The preparing method of a large-area perovskite thin film is a relatively simple process in that it is performed at room temperature without a heat treatment.

According to an embodiment of the present disclosure, the coating may be performed by a coating method selected from the group consisting of spin coating, casting, Langmuir-Blodgett, (LB) deposition, ink-jet printing, nozzle printing, slot die coating, doctor blade coating, screen printing, dip coating, gravure printing, reverse offset printing, a physical transfer method, spray coating, chemical vapor deposition, thermal evaporation, vacuum deposition, and combinations thereof, but may not be limited thereto.

Hereafter, the present disclosure will be described in more detail with reference to examples. The following examples are provided only for explanation, but do not intend to limit the scope of the present disclosure.

[EXAMPLE] PREPARATION OF LARGE-AREA PEROVSKITE THIN FILM $CH_3NH_3PbI_3$ single crystals were exposed to a methylamine gas to obtain $CH_3NH_3PbI_3CH_3NH_2$ in a high viscosity liquid phase. Acetonitrile was added on $CH_3NH_3PbI_3CH_3NH_2$ in the amount of 40 wt % to prepare a coating solution.

Figure 3:
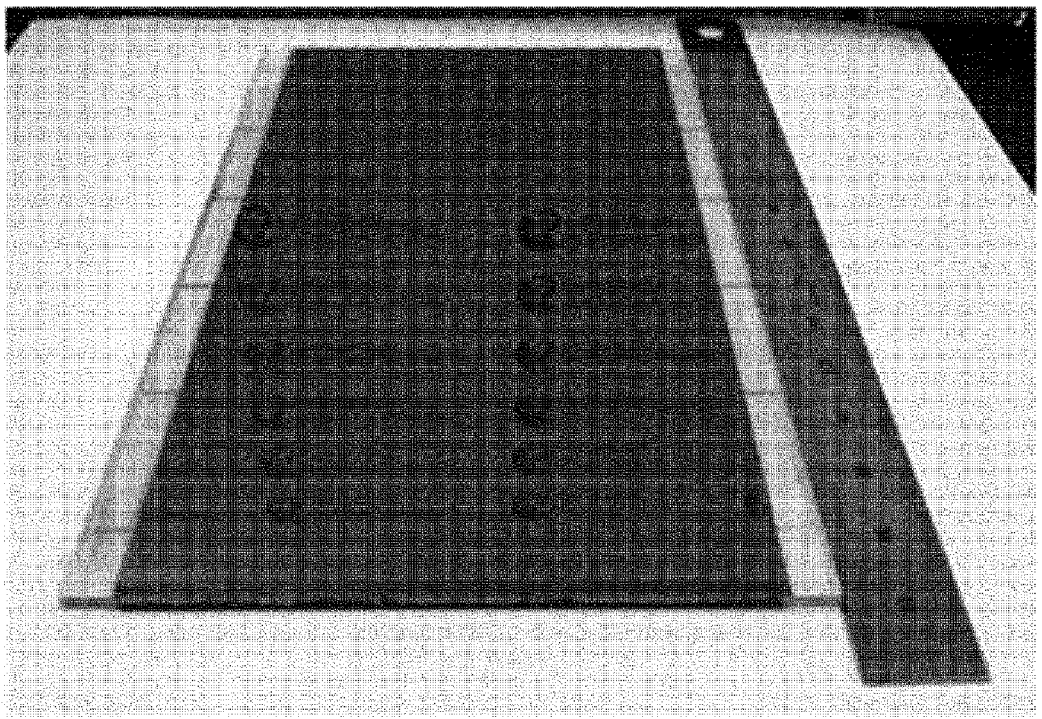
FIG. 3 is a photograph of a large-area perovskite thin film prepared according to an example of the present disclosure.
Figure 4A:
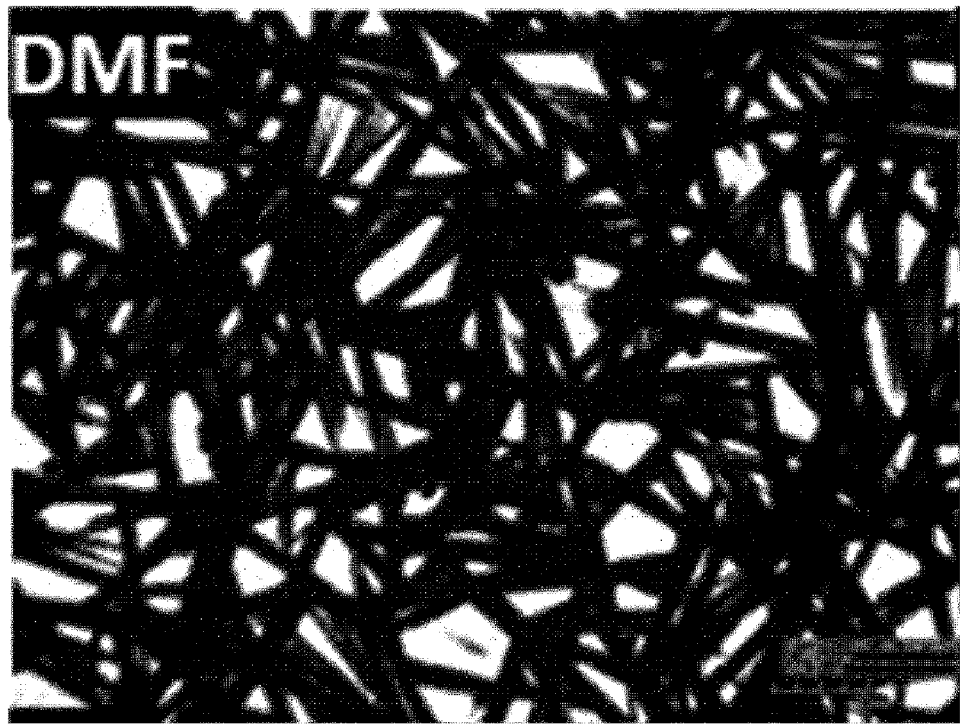
FIG. 4A through FIG. 4E are optical microscopic images of large-area perovskite thin films prepared according to an example and comparative examples, respectively, of the present disclosure.
Figure 4B:
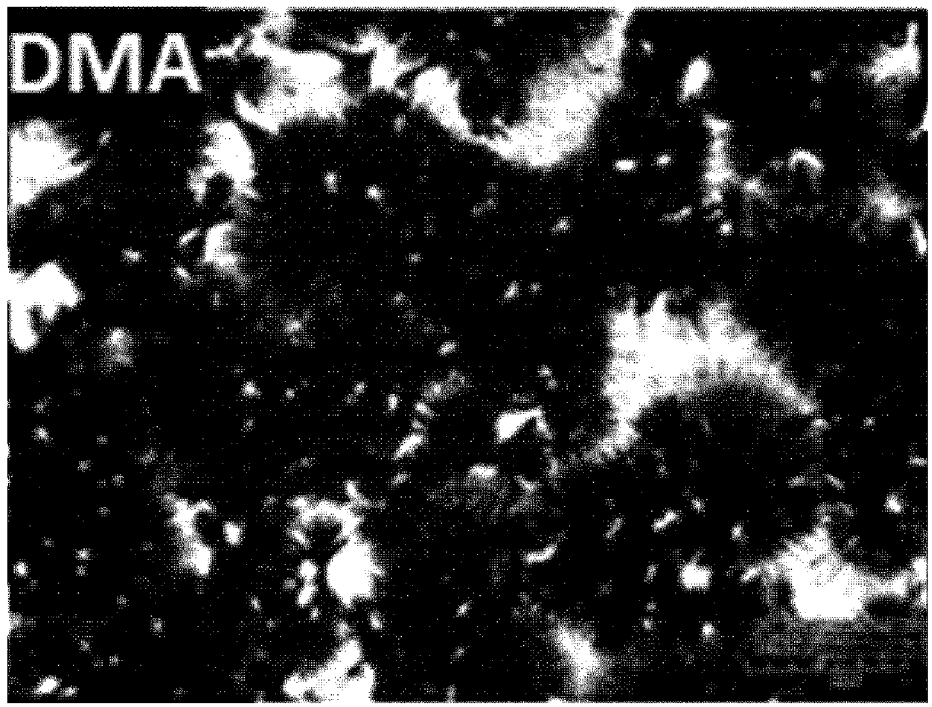
Figure 4C:
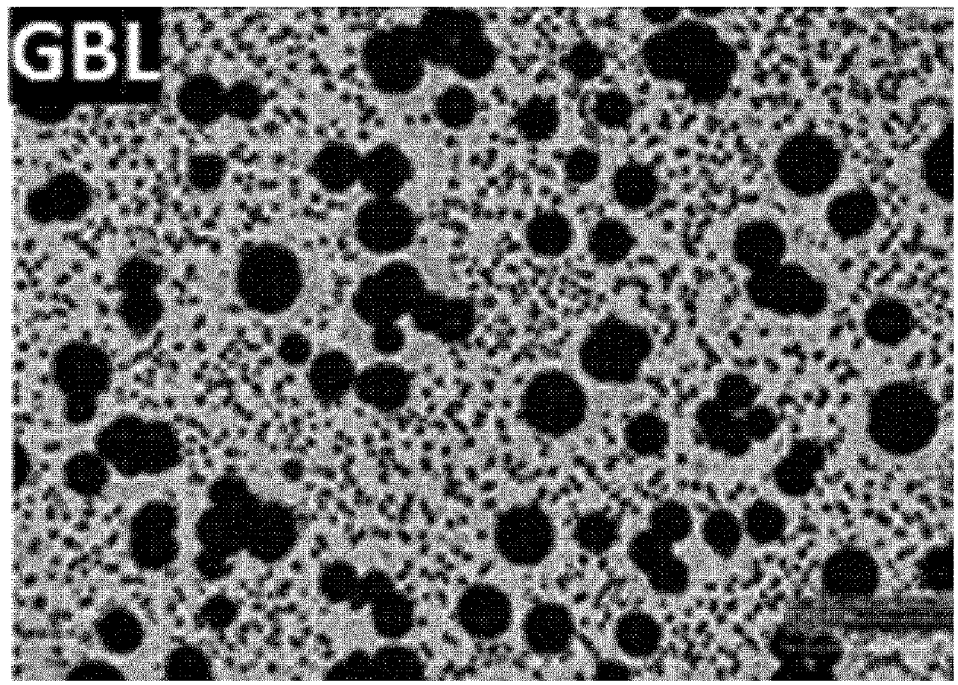
Figure 4D:
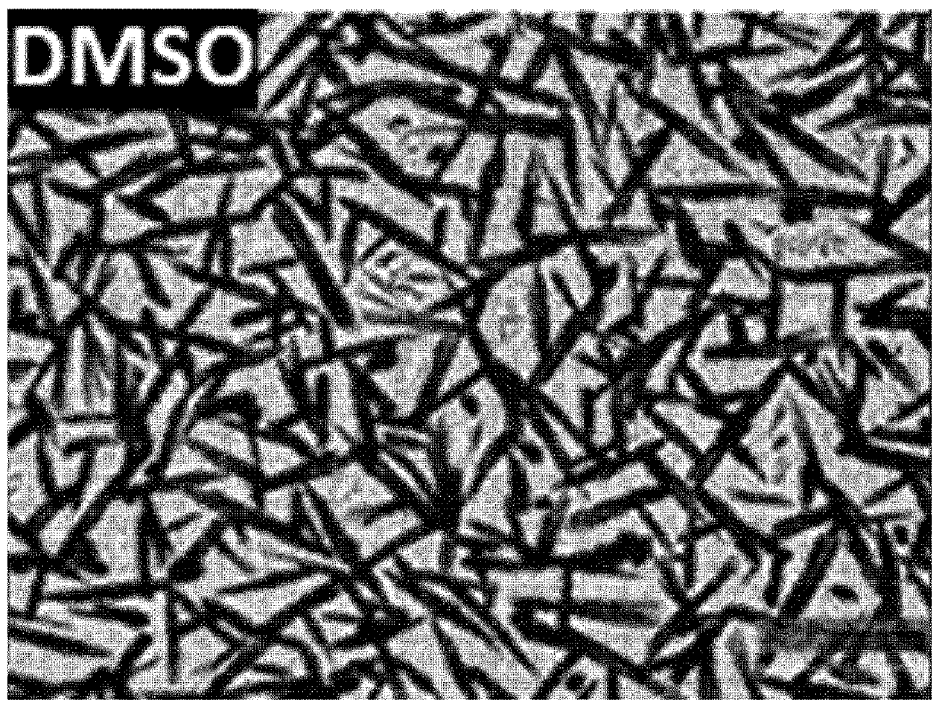
Figure 4E:
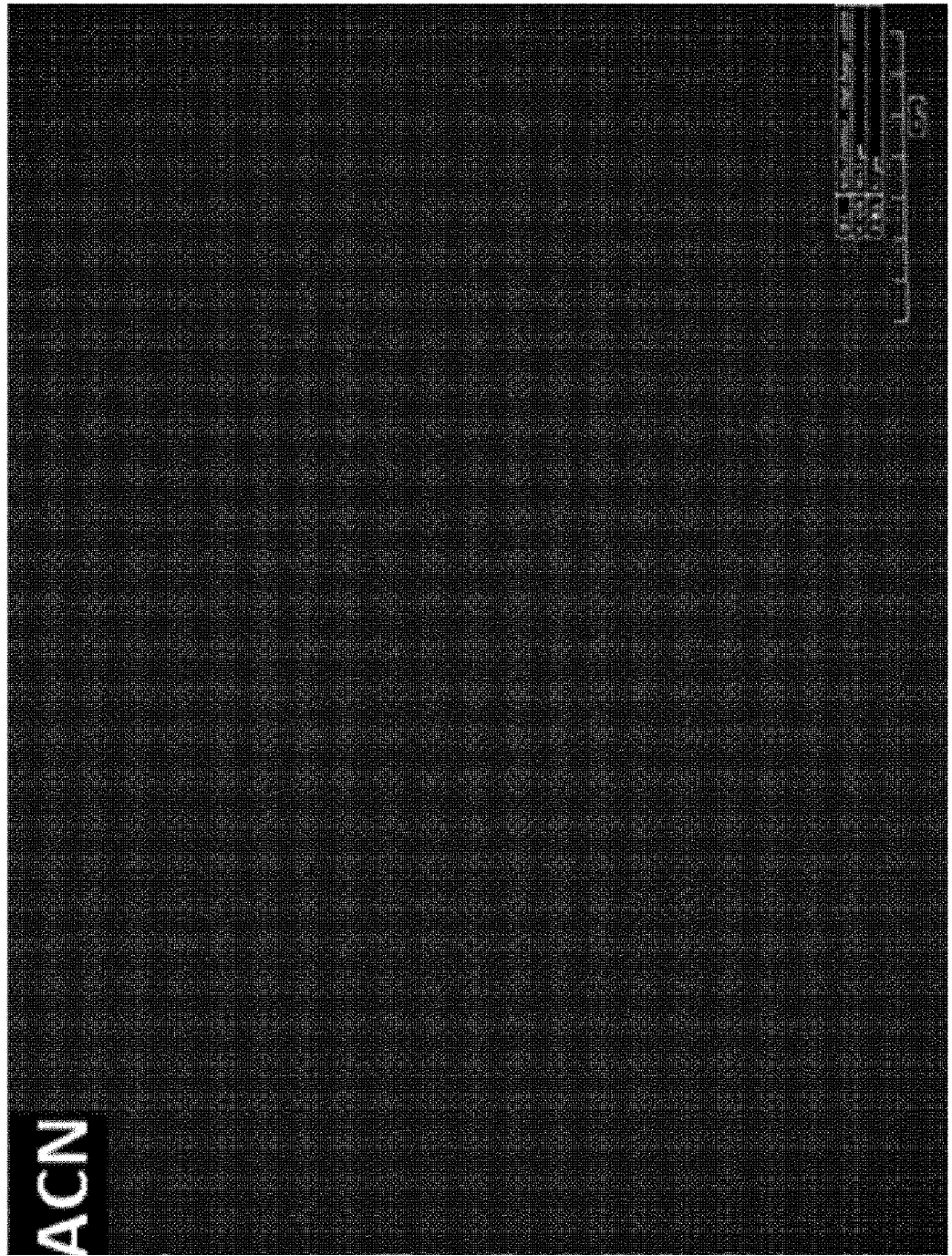

Then, 40 µl of the coating solution was loaded on a bar coater at room temperature and coated on a $SnO_2$-coated FTO substrate at a speed of 40 mm/s. Then, the substrate was heat-treated on a 100° C. hot plate for 30 minutes to prepare a large-area perovskite thin film. FIG. 3 is a photograph of the large-area perovskite thin film prepared according to Example of the present disclosure.

Comparative Example 1

A precursor solution was prepared by dissolving $CH_3NH_3I$, $PbI_2$ in a dimethylformamide (DMF) solution. The precursor solution was filtered using a filter syringe.

Then, a glass substrate was washed in ethanol for 15 minutes using ultrasonic waves. The precursor solution was dropped on the glass substrate and spin-coated at a speed of 4000 rpm for 30 seconds (Acceleration=1000 rpm/s).

Then, diethyl ether was dropped on the coated glass substrate and spin-coated for 10 seconds. Then, chloroform was dropped on the coated $CH_3NH_3PbI_3$ thin film and then dried in a vacuum oven for 10 minutes to form a perovskite thin film.

Comparative Example 2

A perovskite thin film was prepared in the same manner as in Comparative Example 1 except that dimethylamide (DMA) was used instead of dimethylformamide.

Comparative Example 3

A perovskite thin film was prepared in the same manner as in Comparative Example 1 except that gamma-butyrolactone (GBL) was used instead of dimethylformamide.

Comparative Example 4

A perovskite thin film was prepared in the same manner as in Comparative Example 1 except that dimethyl sulfoxide (DMSO) was used instead of dimethylformamide.

Test Example

FIG. 4A through FIG. 4E are optical microscopic images of large-area perovskite thin films prepared according to an example and comparative examples, respectively, of the present disclosure, and FIG. 4A, FIG. 4B, FIG. 4C, FIG. 4D, and FIG. 4E are optical microscopic images of the large-area perovskite thin films prepared according to Comparative Example 1, Comparative Example 2, Comparative Example 3, Comparative Example 4, and Example, respectively.

Referring to FIG. 4A through FIG. 4E, it could be seen that the thin films shown in FIG. 4A through FIG. 4D and prepared by conventional preparing methods of a perovskite thin film were not uniform, with a large number of pinholes and voids present therein. However, it could be seen that the thin film shown in FIG. 4E and prepared by the preparing method of a perovskite thin film according to the present disclosure was uniform with high density without pinholes and voids.

Figure 5:
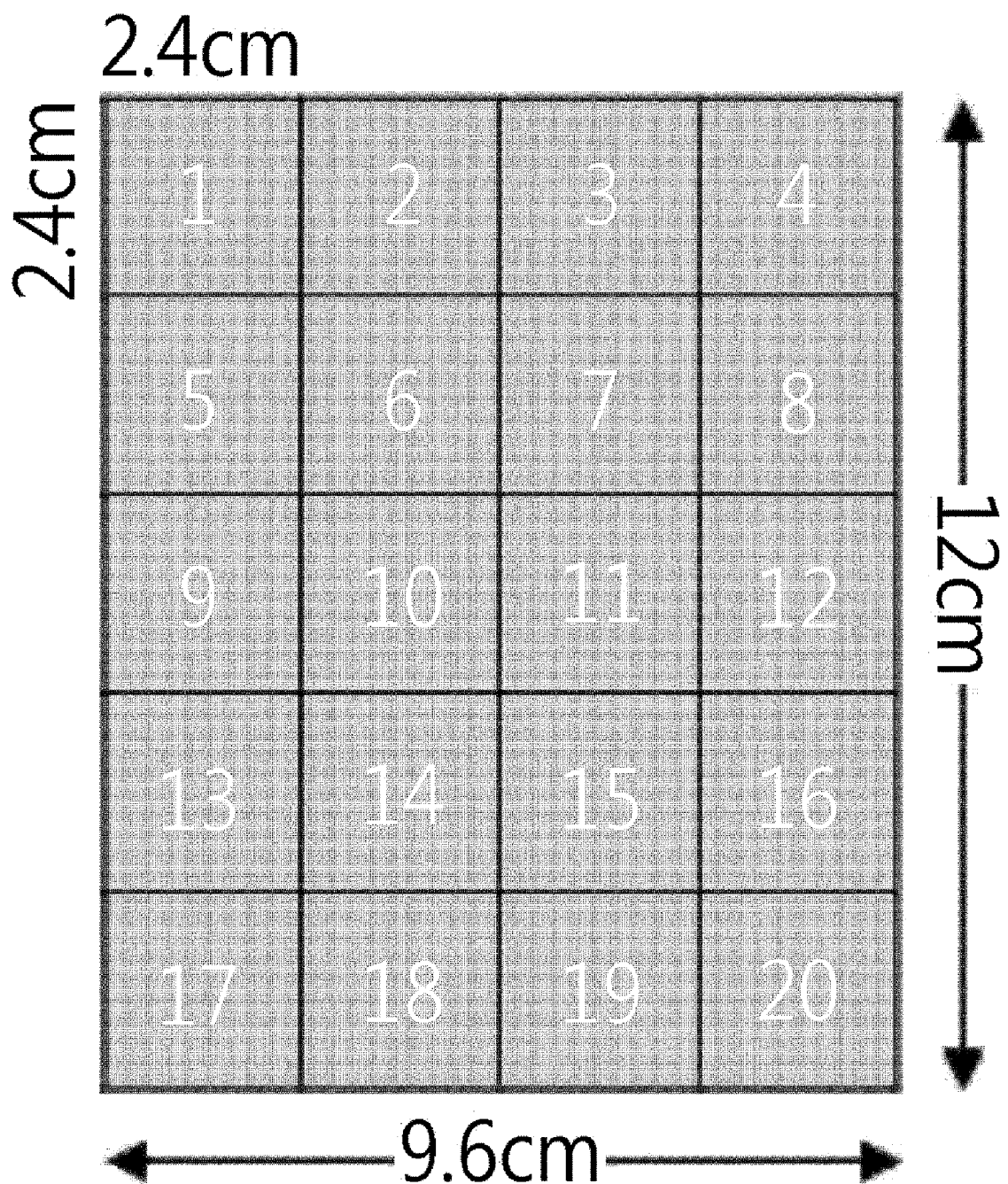
FIG. 5 is an image showing 20 sites and sizes on a substrate of a large-area perovskite thin film prepared according to an example of the present disclosure.

FIG. 5 is an image showing 20 sites and sizes on a substrate of a large-area perovskite thin film prepared according to an example of the present disclosure.

Referring to FIG. 5, it is possible to check the total size of the substrate of the large-area perovskite thin film prepared according to Example and sites and sizes of the prepared unit devices.

Figure 6:
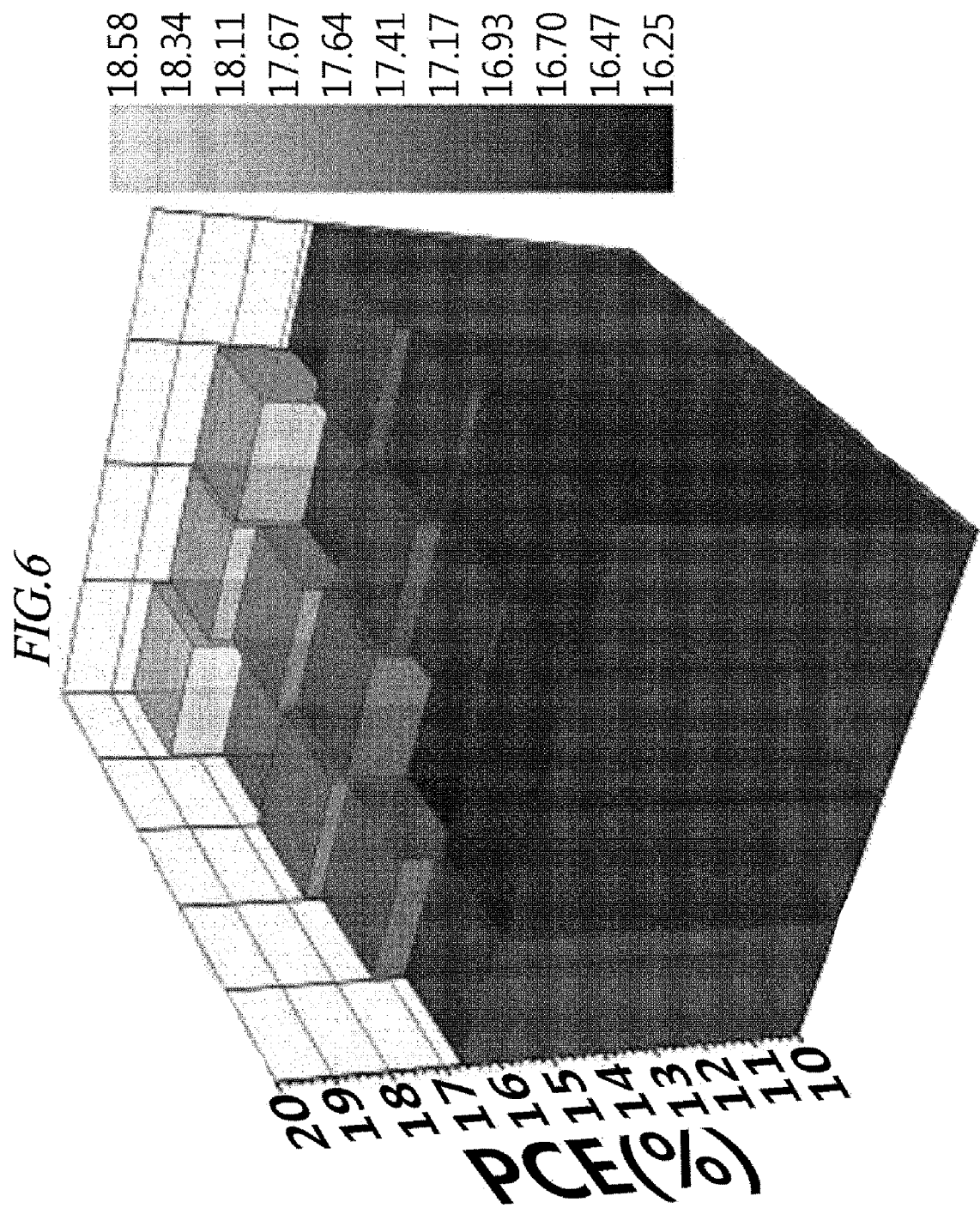
FIG. 6 is a 3D graph showing the photoelectric conversion efficiency of a large-area perovskite thin film prepared according to an example of the present disclosure.

FIG. 6 is a 3D graph showing the photoelectric conversion efficiency of a large-area perovskite thin film prepared according to an example of the present disclosure.

Referring to FIG. 6, it is possible to check that the photoelectric conversion efficiency differs depending on site on the substrate of the large-area perovskite thin film prepared according to Example but the average photoelectric conversion efficiency for all the sites is 17.219%. Further, as the color is darker in the graph, the photoelectric conversion efficiency is lower, and as the color is brighter in the graph, the photoelectric conversion efficiency is higher.

Figure 7:
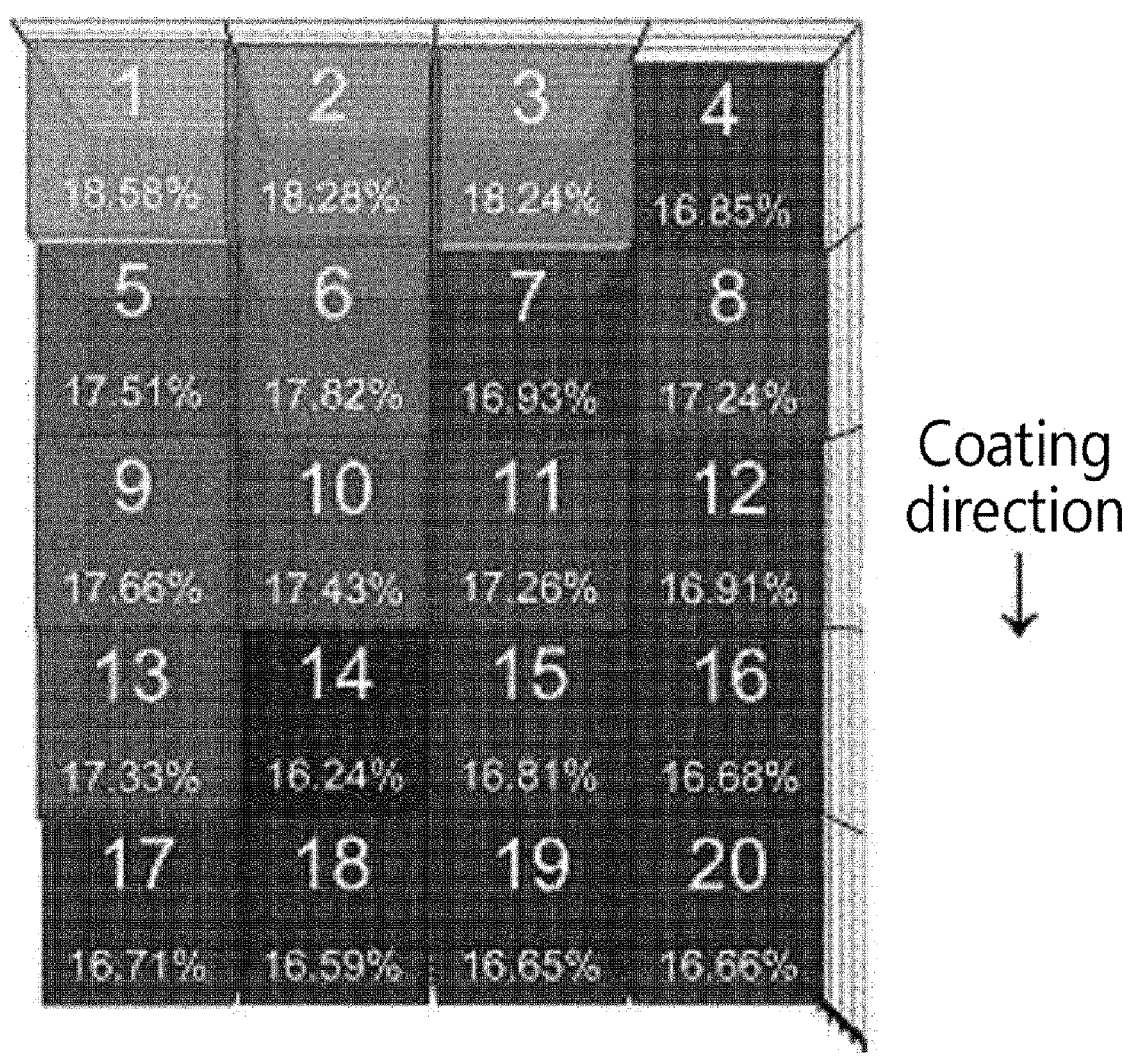
FIG. 7 is a plan view of the 3D graph showing the photoelectric conversion efficiency of a large-area perovskite thin film prepared according to an example of the present disclosure.

FIG. 7 is a plan view of the 3D graph showing the photoelectric conversion efficiency for each size in a preparing method of a large-area perovskite thin film prepared according to an example of the present disclosure.

FIG. 7 shows the graph of FIG. 6 when viewed from above to help easily understand the photoelectric conversion efficiency depending on site. Referring to FIG. 7, as the color is darker in the graph, the photoelectric conversion efficiency is lower, and as the color is brighter in the graph, the photoelectric conversion efficiency is higher.

FIG. 8 is a table showing photoelectric properties of 20 sites on a large-area perovskite thin film prepared according to an example of the present disclosure.

Referring to FIG. 8, the large-area perovskite thin film according to Example showed the photoelectric conversion efficiency similar to that of a conventional perovskite thin film, and the average open-circuit voltage for all the sites was 1.10435 V, the filling factor was 0.770485, the short-circuit current density was 20.2358 mA/cm$^{-2}$, and the photoelectric conversion efficiency was 17.219%.

The above description of the present disclosure is provided for the purpose of illustration, and it would be understood by a person with ordinary skill in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A preparing method of a large-area perovskite thin film, comprising:
    forming an organic metal halide-alkylamine compound by exposing an organic metal halide compound having a perovskite structure to an alkylamine gas;
    preparing a coating solution by adding a solvent on the organic metal halide-alkylamine compound; and
    preparing a perovskite thin film by coating the coating solution on a substrate,
    wherein in the coating of the coating solution, crystallization of the perovskite is rapidly performed due to a high evaporation rate of the alkylamine to form a high-density thin film.

2. The preparing method of a large-area perovskite thin film of claim 1,
    wherein the organic metal halide compound is represented by the following Chemical Formula 1:

RMX$_3$  [Chemical Formula 1]

(In Chemical Formula 1,
    R is a substituted or unsubstituted C$_{1-24}$ alkyl group, and when R is substituted, its substituent is an amino group, a hydroxyl group, a cyano group, a halogen group, a nitro group, or a methoxy group,
    M includes a metal selected from the group consisting of Pb, Cu, Ni, Co, Fe, Mn, Cr, Pd, Cd, Yb, Sn, Ge, and combinations thereof, and
    X includes a halide anion or a chalcogenide anion).

3. The preparing method of a large-area perovskite thin film of claim 1,
    wherein the organic metal halide compound has a single-crystal structure.

4. The preparing method of a large-area perovskite thin film of claim 1,
    wherein the alkylamine gas includes a member selected from the group consisting of
    aliphatic primary alkylamines selected from the group consisting of methylamine, ethylamine, n-propylamine, isopropylamine, n-butylamine, sec-butylamine, isobutylamine, t-butylamine, pentylamine, 2-aminopentane, 3-aminopentane, 1-amino-2-methylbutane, 2-amino-2-methylbutane, 2-amino-2-methylbutane, 3-amino-2-methylbutane, 4-amino-2-methylbutane, hexylamine, 5-amino-2-methylpentane, heptylamine, octylamine, nonylamine, decylamine, undecylamine, dodecylamine, tridecylamine, tetradecylamine, pentadecylamine, hexadecylamine, heptadecylamine, octadecylamine, and combinations thereof;
    aliphatic secondary alkylamines selected from the group consisting of dimethylamine, diethylamine, dipropylamine, diisopropylamine, dibutylamine, diisobutylamine, di-sec-butylamine, di-t-butylamine, dipentylamine, dihexylamine, diheptylamine, dioctylamine, dinonylamine, didecylamine, methylethylamine, methylpropylamine, methylisopropylamine, methylbutylamine, methylisobutylamine, methyl-sec-butylamine, methyl-t-butylamine, methylamylamine, methylisoamylamine, ethylpropylamine, ethylisopropylamine, ethylbutylamine, ethylisobutylamine, ethyl-sec-butylamine, ethyl-t-butylamine, ethylisoamylamine, propylbutylamine, propylisobutylamine, and combinations thereof; and
    aliphatic tertiary alkylamines selected from the group consisting of trimethylamine, triethylamine, tripropylamine, tributylamine, tripentylamine, dimethylethylamine, dimethylpropylamine, methyldiethylamine, methyldipropylamine, and combinations thereof.

5. The preparing method of a large-area perovskite thin film of claim 1,
wherein the solvent includes a volatile organic solvent selected from the group consisting of acetonitrile, methanol, ethanol, acetone, butanol, isopropyl alcohol, and combinations thereof.

6. The preparing method of a large-area perovskite thin film of claim 1,
wherein the organic metal halide compound is in a solid phase.

7. The preparing method of a large-area perovskite thin film of claim 1,
wherein the organic metal halide-alkylamine compound is in a liquid phase.

8. The preparing method of a large-area perovskite thin film of claim 1,
wherein the organic metal halide compound reversibly phase changes between solid and liquid depending on partial pressure of the alkylamine gas.

9. The preparing method of a large-area perovskite thin film of claim 1,
wherein the preparing method of a large-area perovskite thin film is performed at room temperature.

10. The preparing method of a large-area perovskite thin film of claim 1,
wherein the preparing method of a large-area perovskite thin film is performed without a separate heat treatment.

11. The preparing method of a large-area perovskite thin film of claim 1,
wherein the solvent is contained in the coating solution in the amount of from 10 wt % to 70 wt %.

12. The preparing method of a large-area perovskite thin film of claim 1,
wherein the coating is performed by a coating method selected from the group consisting of spin coating, casting, Langmuir-Blodgett, (LB) deposition, ink-jet printing, nozzle printing, slot die coating, doctor blade coating, screen printing, dip coating, gravure printing, reverse offset printing, a physical transfer method, spray coating, chemical vapor deposition, thermal evaporation, vacuum deposition, and combinations thereof.

\* \* \* \* \*